(12) United States Patent
Olzak et al.

(10) Patent No.: US 6,741,896 B1
(45) Date of Patent: May 25, 2004

(54) POWER BACKUP APPLICATION TO MAINTAIN NORMAL FLIGHT RECORDER OPERATION FOR A SPECIFIED PERIOD OF TIME IN CASE OF AIRCRAFT POWER FAILURE OR INTERRUPTION

(75) Inventors: Richard Olzak, Kirkland, WA (US); Duncan Schofield, Bellevue, WA (US); Gary Kersten, Duvall, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/569,375

(22) Filed: May 11, 2000

Related U.S. Application Data

(63) Continuation-in-part of application No. 09/054,059, filed on Apr. 2, 1998, now Pat. No. 6,153,720.
(60) Provisional application No. 60/149,008, filed on Aug. 13, 1999.

(51) Int. Cl.[7] .............................. G06F 7/00; H02J 7/00
(52) U.S. Cl. ..................... 700/82; 700/286; 701/14; 307/66; 320/134
(58) Field of Search .................... 700/79, 82, 286; 701/3, 14; 320/104, 134; 307/64–66

(56) References Cited

U.S. PATENT DOCUMENTS

| | | | | | |
|---|---|---|---|---|---|
| 5,187,382 | A | * | 2/1993 | Kondo | 307/10.1 |
| 5,302,858 | A | * | 4/1994 | Folts | 307/66 |
| 5,519,663 | A | * | 5/1996 | Harper, Jr. et al. | 365/229 |
| RE35,590 | E | * | 8/1997 | Bezos et al. | 364/424.04 |
| 5,744,876 | A | * | 4/1998 | Fangio | 307/66 |
| 5,864,221 | A | * | 1/1999 | Downs et al. | 320/134 |

* cited by examiner

Primary Examiner—Emanuel Todd Voeltz
(74) Attorney, Agent, or Firm—Honeywell Int'l Inc.

(57) ABSTRACT

A device and method to provide backup electrical power to a vehicle data acquisition and recording system. The device operates to control its charging state, discharge state, and interval of discharge to ensure reliable operation of the recording system. The method delineates the process by which continuous electrical power can be supplied to the recording system.

19 Claims, 5 Drawing Sheets

POWER BACKUP APPLICATION TO MAINTAIN NORMAL FLIGHT RECORDER OPERATION FOR A SPECIFIED PERIOD OF TIME IN CASE OF AIRCRAFT POWER FAILURE OR INTERRUPTION

This application claims priority from U.S. Provisional Application Serial No. 60/149,008 filed on Aug. 13, 1999 and is a continuation-in-part of and claims priority from Ser. No. 09/054,059 filed Apr. 2, 1998, now U.S. Pat. No. 6,153,720, titled "Data and Cockpit Voice Recorder Enclosure", the entire specifications of which are hereby incorporated by reference.

BACKGROUND OF THE INVENTION

The present invention is directed toward a backup power supply for a crash-survivable data memory unit that is capable of providing continued operation of the device upon loss of electrical power.

The Federal Aviation Administration requires that most commercial aircraft be equipped with a crash-survivable flight data recorder (FDR) and cockpit voice recorder (CVR). Such systems collect vital flight information that provides evidence for the reconstruction and analysis of a subsequent accident. The FDR and CVR is usually powered from a vital electrical bus to ensure operation in all foreseeable operating configurations.

There have been several aircraft accidents in which FDR and CVR recording was discontinued prior to the crash, due to a loss of some or all electrical systems in the aircraft. In these cases, the National Transportation and Safety Board (NTSB) noted that continued operation of either recorder during the power outage could have provided accident investigators with valuable information regarding the cause of the crash.

In its Mar. 9, 1999 letter to the FAA, the NTSB has recommended that, starting in 2005, all aircraft that are required to carry CVRs and FDRs be fitted with an independent power source that is located with the CVR, and automatically engages to provide ten minutes of operation whenever aircraft power to the recorder ceases, either by normal shutdown or through an electrical bus failure/loss. In addition, the NTSB has recommended that all aircraft manufactured after Jan. 1, 2003 be equipped with dual combination (CVR/FDR) recording systems, each powered from a separate, reliable aircraft power supply. Each requirement is an attempt to ensure that FDR and CVR data is recorded during aircraft power outages. There are no systems in the present art, however, that meet the first recommendation, and the second recommendation would be ineffective in collection of data in the event of a total aircraft loss of power.

Backup power sources for FDRs and CVRs have not been previously developed for several reasons. First, older FDRs and CVRs, many of which are still in the field, store data on a continuously-driven magnetic tape. The electrical power required to operate such tape drives, even for a short period of time, requires large and heavy power storage devices that are infeasible for aircraft. Second, a power backup to the CVR and/or FDR could have negative consequences if power to the recorder continues after a crash, allowing it to overwrite vital data in doing so. Finally, the FDR can continue to receive useful data during a power loss only if the sensors supplying it also retain power. The complexity and variation in modern aircraft electrical systems prevents a feasible supply of power to the sensors. Because the CVR and FDR power problems are linked, a division of the backup power supplies for them was deemed an incomplete solution to the overall problem. For at least these reasons, backup power supplies for the FDR and CVR have not been mandated by the NTSB, nor have they been installed on aircraft.

SUMMARY OF THE INVENTION

The present invention recognizes and utilizes recent developments in several fields of invention to make possible a backup power supply for vehicle data acquisition and recording systems. For example, traditional magnetic tape storage units have been largely replaced by low-power solid state memory devices. Thus, the size of a backup power storage device that will supply the required amount of power is much smaller, making it feasible for installation in aircraft. In addition, the development of lithium batteries has reduced the size and weight of batteries for a given energy storage requirement. These aspects combined with new smaller and lighter FDR/CVR designs, as described in U.S. Pat. No. 6,153,720 and incorporated herein, make it feasible to incorporate an additional backup power supply into an FDR or CVR as taught by the present invention.

According to one aspect of the present invention, the problems of supplying backup power to FDRs and CVRs are identified by analyzing the specific and different power needs of FDRs and CVRs. Aspects of FDR and CVR operation, during startup, operating, shutdown, accident phase, and post-crash phase are defined. According to another aspect of the invention, a system that ensures reliability of power and continuity of important data acquisition throughout each of the aforementioned phases is described, as summarized in the following paragraphs.

According to yet another aspect of the present invention, a device is disclosed that provides backup electrical power for a vehicle data acquisition and recording system. The device includes a charging control circuit, a discharge control circuit, and a power storage element. The invention receives charging power from an external vehicle electrical bus, and maintains a continuity of power to the recording system in the event of a loss of said bus.

According to still another aspect of the present invention, a method is disclosed for providing backup electrical power for a vehicle data acquisition and recording system, by delineating a process in which a vehicle electrical bus is monitored for power availability, and the system operates either in charging or discharging mode depending on the status of the bus. In addition, a process step includes monitoring the duration of a discharge cycle, and causes a discontinuation of power to the recording system after a pre-determined interval, to ensure that vital data is not over-written after an accident.

These and other aspects of the present invention are described further in the detailed description of the preferred embodiments of the invention which follow.

DESCRIPTION OF THE PREFERRED EMBODIMENTS

The backup power supply invention enables continued operation of a FDR or CVR following an event which otherwise would prevent operation of the recording system. In the past, there have occurred several accidents in which continued operation of either recorder would possibly have provided post-crash investigators with valuable additional information.

Events which pose threats to the power supply for the FDR or CVR also threaten the aircraft wiring which connects the recorder to the signal sources providing the requisite information to be recorded. Therefore, any attempt to provide for continued operation of a flight recorder in a situation which jeopardizes the aircraft must consider both the power and the signal source interconnections.

Feasibility Considerations For the FDR

Figure 1:
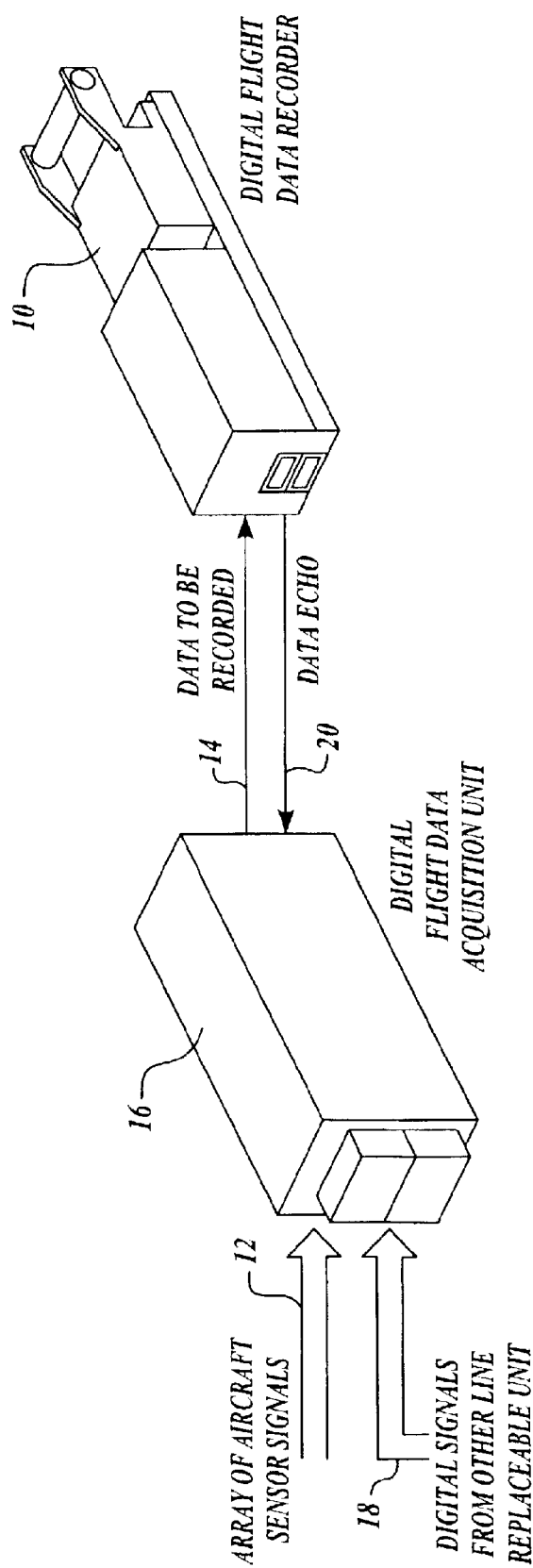
FIG. 1 is an illustration of a prior art flight data recording system.

FIG. 1 provides an illustration of a typical prior art aircraft flight data recording system. The flight data recorder 10 is a single component of a data acquisition and recording system that is widely distributed in an overall aircraft system. The recording system includes individual sensors that provide voltage signals 12 representing a wide variety of activities and digital links 18 to other aircraft systems such as a digital air data computer (not shown). The information is gathered and formatted into a predetermined digital representation by a digital flight data acquisition unit (DFDAU) 16 which is usually a separate line replaceable unit (LRU) centrally located for ease of interconnection.

In the most modern digital aircraft systems, the function of DFDAU 16 may be performed within some of the individual elements of the larger system outside of DFDAU 16. Formatted digital signals 18 from those elements can be collected by DFDAU 16 for further consolidation and processing. The formatted digital representation 14 of the aircraft information is then sent to the digital flight data recorder 10, which serves as the crash protected memory element of the entire data recording system. The recorded data 20 is then re-transmitted to DFDAU 16 for integrity checking.

For an uninterruptible power scheme to be effective for the data recording system, then, it is necessary to ensure continuity of power to a number of sensors and other aircraft avionics in addition to the FDR. The elements of the flight recording system are inter-connected with an extensive, complex network of aircraft wiring. For the system to continue useful operation during a serious casualty situation, it may be unlikely that the system wiring integrity can be maintained, either because of system damage or as a result of tripping of circuit breakers by the flight crew during emergency troubleshooting. Providing continuous power to an FDR may cause more harm than good by overwriting useful data with null values from sensors in-activated by the emergency. Thus, since backup power for all FDR-related systems is infeasible, it is also not desirable to provide backup power solely to the FDR.

Feasibility Considerations For The CVR

Figure 2:
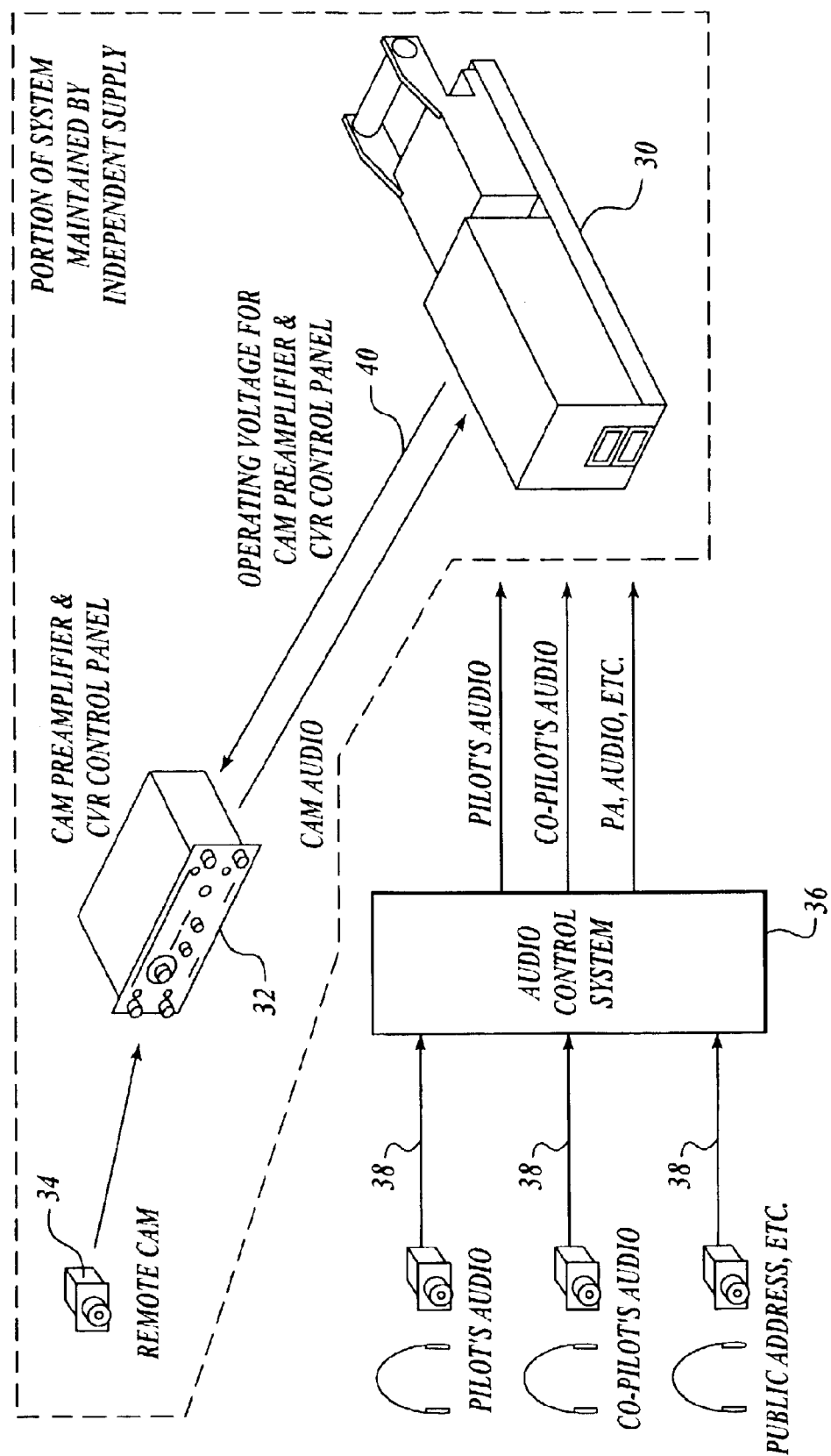
FIG. 2 illustrates a cockpit voice recording system, with portions to be supplied by backup electrical power supply enclosed within the dashed line, according to one preferred embodiment of the present invention.

Compared to the flight data recording system, the cockpit voice recorder (CVR) system is more self-contained. As illustrated in FIG. 2, the CVR system is comprised of a cockpit voice recorder 30, a subsystem for the cockpit area microphone(CAM) consisting of a CAM preamplifier/control panel 32 and a remote CAM 34, and the aircraft audio control system 36 for pilot, co-pilot, and public address/flight engineer audio signals 38. The CAM subsystem receives power 40 directly from the CVR 30. A backup power supply for CVR 30 thus also provides the CAM subsystem a high probability of continued operation during an extensive aircraft electrical system failure. In addition, if the CVR is located in the forward section of the aircraft close to the cockpit, the length of wire necessary to connect the CAM subsystem to the CVR is minimized, improving electrical system robustness to the CAM/CVR combination during emergencies. For the other components of the system, namely aircraft audio control system 36, a design complication arises similar to that discussed in relation to FDR. Namely, the involvement of other aircraft systems whose function is not specifically related to the CVR adds sufficient complexity to reduce the likelihood of successful continued operation.

Many modern control systems and flight parameter indicators are powered electrically, and therefore a flight crew may experience a complete loss of aircraft control in a serious electrical system failure in-flight. Hence, the most important data to be recorded during such an emergency may be a record of the crew's cockpit voice conversation as it troubleshoots the system and attempts to restore electrical power. A preferred embodiment of the present invention provides a backup power supply for the CVR and CAM systems.

Independent Power Sources

Figure 3:
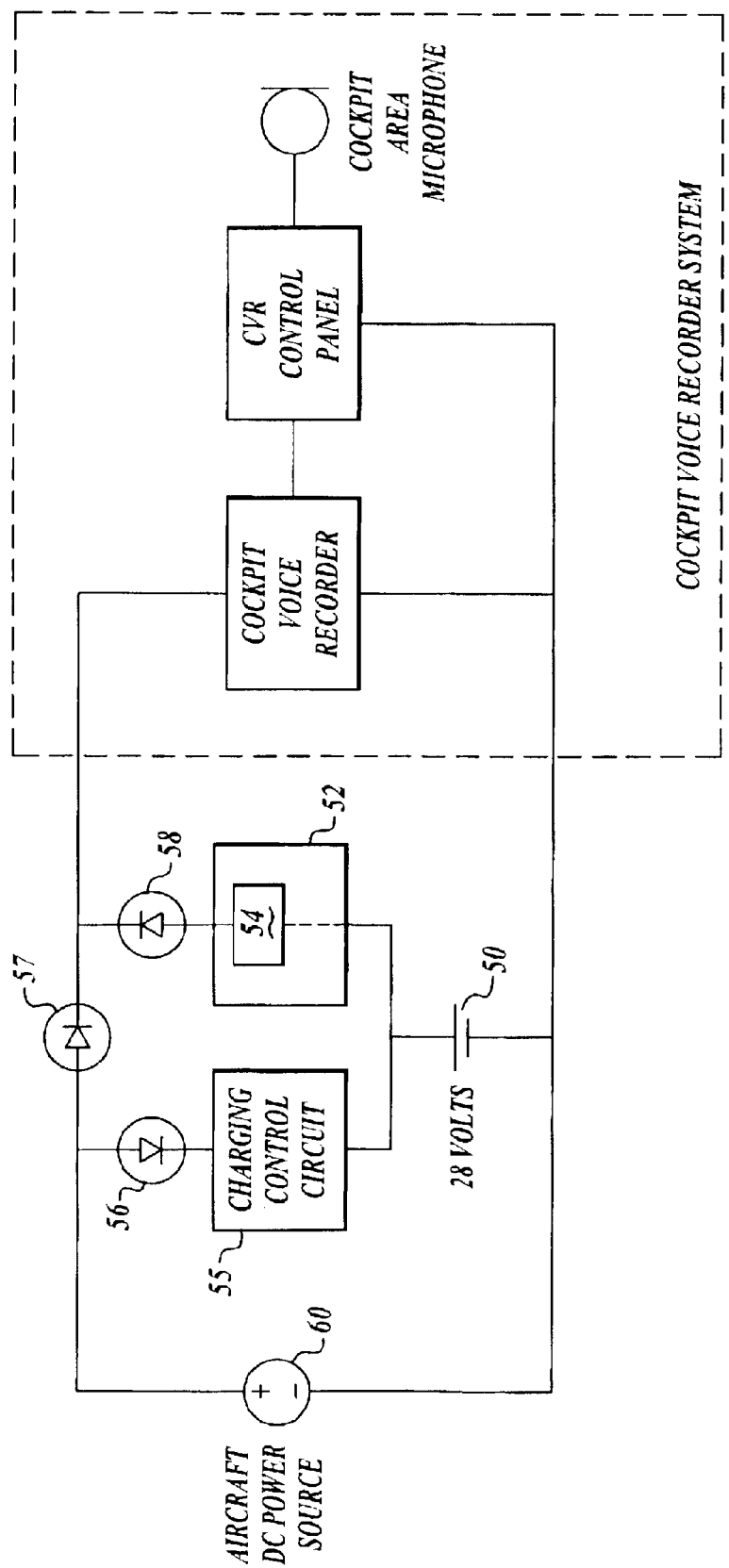
FIG. 3 illustrates an embodiment of the backup electrical power supply in which the backup source of power is stored in a battery.
Figure 4:
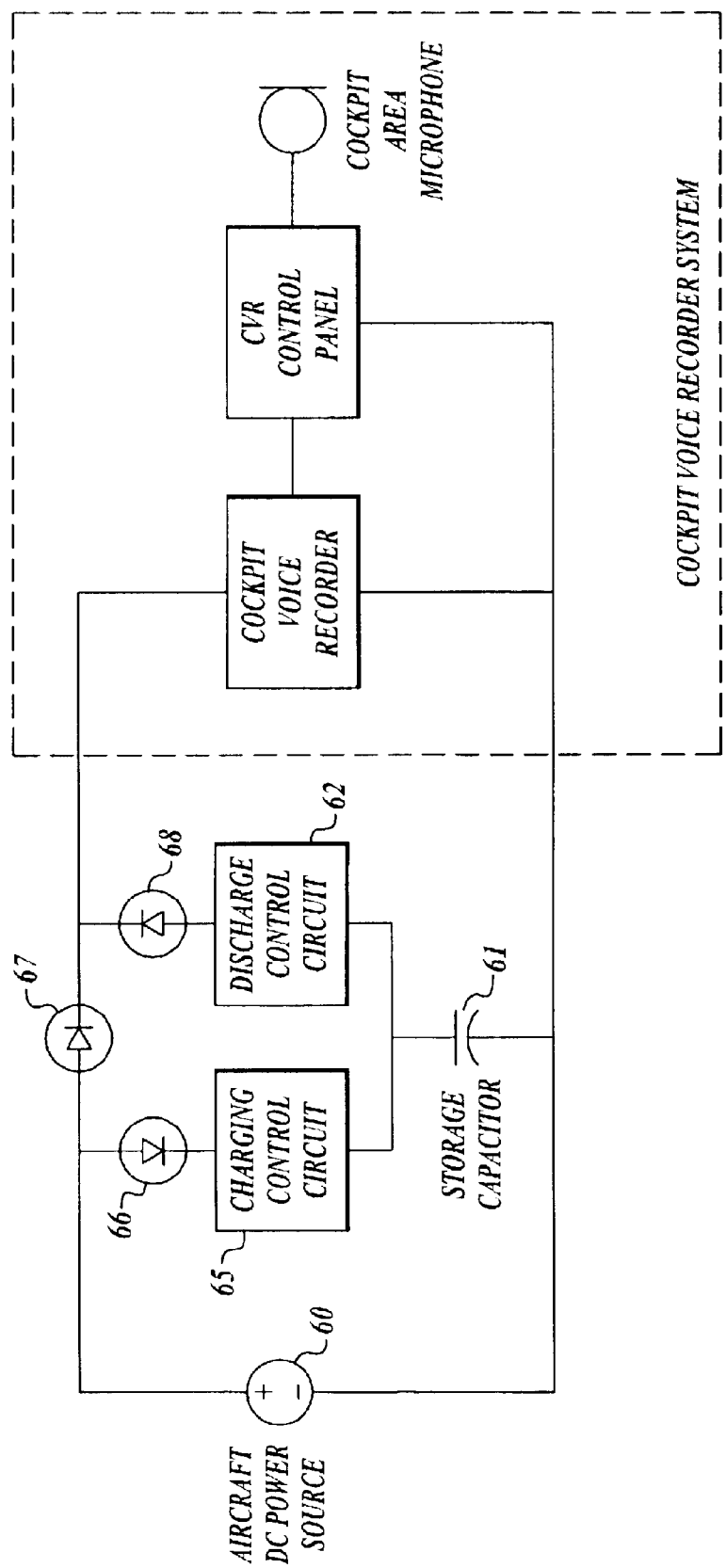
FIG. 4 illustrates an embodiment of the backup electrical power supply in which the backup source of power is stored in a capacitor.

There are at least two alternative embodiments for a backup power source capable of supplying sufficient electrical energy to enable the CVR to continue operation for 10 minutes following the loss of main aircraft power. FIGS. 3 and 4 illustrate each approach.

The first embodiment, a battery-powered system, is illustrated in FIG. 3. This embodiment includes a battery 50 for energy storage, preferably a 28-volt lithium cell. Available batteries typically supply considerably more energy, of the order of 10 Amp-Hours, than is required for this application, so an element to disconnect the battery after the specified operational duration must be included. Thus a timer element 54 is included within the discharge control circuit 52. A charging control circuit 55 functions to sense the state of the battery charge and to control battery recharging. Diodes 56, 57 and 58 permit the interconnection of the aircraft DC power source 60, the battery backup invention, and the CVR system.

The battery backup system functions as follows. When the aircraft electrical system is initialized, aircraft DC power source 60 provides power to the CVR and to the battery backup system. Power source 60 charges battery 50 through diode 56 and charging control circuit 55. Charging control circuit 55 is configured to bring the battery to a charge state sufficient to operate the CVR system for a specified period of time, which, in a preferred embodiment, is 10 minutes. AC preferred charging time to bring the battery to the sufficient charge state is 30 minutes, which is the shortest time expected between aircraft startup and departure from the gate area. After battery 50 is fully charged, charging control circuit 55 maintains the battery charge state, and may provide additional functionality to improve battery life.

During normal operation, CVR power is supplied by aircraft DC power source 60 through diode 57.

In the event of an in-flight electrical power loss, battery 50 automatically provides backup power to the CVR system through discharge control circuit 52 and diode 58. Diodes 56 and 57 prevent battery power back-flow to the remainder of the aircraft power bus. Discharge control circuit 52 regulates current flow for protection and also includes a timing element 54 which automatically discontinues backup power to the CVR after a pre-determined period of about ten minutes. This feature prevents inadvertent overwriting of null data into the CVR after an accident.

When aircraft power is secured under normal circumstances, discharge control circuit 52 activates in the same manner as described for emergency situations. The backup power system is then ready for re-initiation.

The second embodiment of the invention is shown in FIG. 4. This embodiment employs a high-capacity capacitor 60 which stores electrical energy during normal operation. When main power is removed, the capacitor discharges to the CVR to provide backup power.

Figure 5:
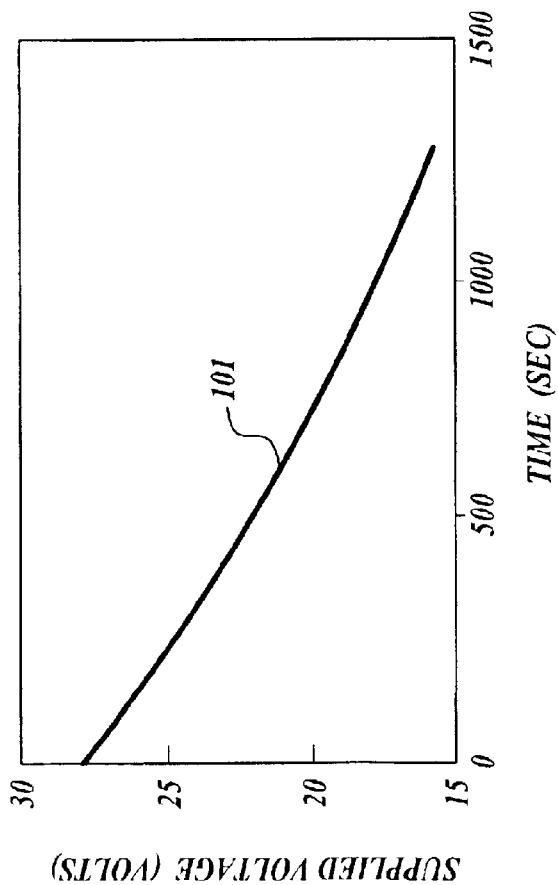
FIG. 5 is a graphical representation of the time versus supply voltage curves for determining the required electrical energy storage capacity of a capacitor, based on the power requirements of a typical cockpit voice recorder system for a period of ten minutes, as determined according to the teachings of the present invention.

The desired capacitance can easily be determined, and is shown for nominal conditions in FIG. 5. As illustrated in curve 101 of FIG. 5, a 28 Farad capacitor can supply a required 10 watt power for about 10 minutes before voltage drops below the 16 volt minimum threshold for a typical CVR. The capacitor can be more easily sized such that the CVR will shut off on undervoltage near the specified backup period, so no timing circuit is required within discharge control circuit 62. A charging control circuit 65 senses the state of the capacitor charge and controls capacitor recharging. Diodes 66, 67 and 68 permit the interconnection of the aircraft DC power source 60, the capacitor backup invention, and the CVR system.

The capacitor backup system functions as follows. When the aircraft electrical system is initialized, aircraft DC power source 60 provides power to the CVR and to the capacitor backup system. Power source 60 charges the capacitor 61 through diode 66 and charging control circuit 65. Charging control circuit 65 is configured to bring capacitor 61 to a charge state sufficient to operate the CVR system for a specified period of time, which, in a preferred embodiment, is 10 minutes. A preferred charging time to bring capacitor 61 to the sufficient charge state is 30 minutes, which is the shortest time expected between aircraft startup and departure from the gate area. After capacitor 61 is fully charged, charging control circuit 65 will maintain the capacitor charge state. During normal operation, CVR power will be supplied by aircraft DC power source 60 through diode 67.

In the event of an in-flight electrical power loss, capacitor 61 automatically provides backup power to the CVR system through discharge control circuit 62 and diode 68. Diodes 66 and 67 prevent capacitor power back-flow to the remainder of the aircraft power bus. Discharge control circuit 62 regulates current flow for protection until the capacitor voltage falls below the minimum CVR operating voltage, after a pre-determined period of about ten minutes. This feature prevents inadvertent overwriting of null data into the CVR after an accident.

When aircraft power is secured under normal circumstances, discharge control circuit 62 activates in the same manner as described for emergency situations. The backup power system is then ready for re-initiation.

Typical operating requirements for an independent power source for the CVR according to one embodiment of the invention, are shown in Table 1. For some entries, suggested tolerance ranges are indicated.

TABLE 1

Typical Specifications of the Preferred Embodiment

| Requirement | Specification |
|---|---|
| Duration of continued operation | 10 minutes ($10 \leq t \leq 12$ minutes) |
| Voltage | Greater than the minimum operating voltage for the CVR for the duration. |
| Charging time | <30 minutes {The system is preferably capable of providing the required function from the actual departure from the originating terminal gate until the safe arrival at the destination terminal gate.} |
| Isolation from aircraft systems | During charging, must not interfere with the continued proper operation of other LRU supplied from the same bus; during discharge, preferably supplies only the CVR. |
| Maintenance | Minimal |
| Interconnection | The installation preferably minimizes the risk of interconnection failure during hazards to the aircraft. |
| Prevention of accidental erasure | The system should preferably be installed to prevent continued recording should the CVR become separated from the aircraft. |

Table 2 lists a number of design considerations and provides a relative indication of the complexity of the two independent power options discussed above. The information provided is intended only as a qualitative indication of the relative standing of the two options.

TABLE 2

Comparison of Battery and Capacitor Sources

| Item of Comparison | Capacitor | Battery |
|---|---|---|
| Cost | − | + |
| Charging circuit complexity | − | + |
| Discharging circuit complexity | + | − |
| Weight | − | + |
| Volume | − | + |
| Maintainability | + | − |
| Reliability | − | − |
| Maintenance hazard | − | + |

+ indicates a relatively favorable characteristic.

Vehicle Interface

Supplying the FDR or CVR with an independent power source capable of sustaining proper operation following the removal of the main vehicle power requires that the device be supplied from a DC power bus. For large transport aircraft, FDRs and CVRs have normally been supplied with 115 VAC/400 Hz AC power. One alternative solution to operating with an aircraft ac power source instead of a dc power source includes the addition of a dc-ac converting element to discharge control circuit 52/62 and eliminating diode 57/67, for the battery supply embodiment and the capacitor supply embodiment respectively. Another alternative solution to operating with an aircraft ac power source is the addition of an ac-dc rectifier element between the ac power source and diodes 56/66 and 57/67, when utilizing a dc-powered CVR or FDR.

To achieve the maximum probability of continued operation of the CVR during a hazardous condition, the equipment should preferably be located as close to the cockpit as possible. Thus, a third alternative solution to the ac power source utilizes a small, lightweight, DC powered CVR mounted directly in the cockpit, with a power connection to the main electrical system only. An embodiment of this embodiment of CVR is described in U.S. Pat. No. 6,153,720.

The foregoing is illustrative of the present invention and is not to be construed as limiting thereof. Variations and modifications will be readily apparent to those of ordinary skill in the art. The invention is defined by the following claims, with equivalents of the claims to be included therein.

That which is claimed is:

1. A backup electrical power supply for a vehicle data acquisition and recording system, comprising:
   a) a power storage device;
   b) charging means to charge said power storage device from a vehicle electrical power supply;
   c) discharge means to control an output voltage from said power storage device to the recording system for a specified period of time; and
   d) means to automatically activate said charging means and said discharge means according to an availability of power from said vehicle electrical power supply.

2. The backup power supply of claim 1, wherein said power storage device is a battery.

3. The backup power supply of claim 2, wherein said battery is integral to said vehicle data acquisition and recording system.

4. The backup power supply of claim 1, wherein said power storage device is a capacitor.

5. The backup power supply of claim 4, wherein said capacitor is integral to said vehicle data acquisition and recording system.

6. The backup power supply of claim 1, wherein said power supply provides electrical power to at least one of a source of data to said vehicle data acquisition and recording system.

7. The backup electrical power supply of claim 1, wherein the vehicle data acquisition and recording system comprises an aircraft flight data recorder.

8. The backup electrical power supply of claim 1, wherein the vehicle data acquisition and recording system comprises a combined aircraft flight data recorder and aircraft cockpit voice recorder.

9. The backup electrical power supply of claim 1, additionally comprising a dc-ac converter coupled to said power supply.

10. A backup electrical power supply for an aircraft cockpit voice recording system, comprising:
    a) a power storage device;
    b) charging means to charge said power storage device from an aircraft electrical power supply;
    c) discharge means to control an output voltage from said power storage device to said recording system for a specified period of time; and
    d) means to automatically activate said charging means and said discharge means according to an availability of power from said aircraft electrical power supply.

11. The backup power supply of claim 10, wherein said power storage device is a battery.

12. The backup power supply of claim 11, wherein said battery is integral to said cockpit voice recording system.

13. The backup power supply of claim 10, wherein said power storage device is a capacitor.

14. The backup power supply of claim 13, wherein said capacitor is integral to said cockpit voice recording system.

15. The backup power supply of claim 10, wherein said power supply provides electrical power to at least one of a source of data to said cockpit voice recording system.

16. The backup power supply of claim 15, wherein said source of data is a cockpit area microphone system.

17. The backup electrical power supply of claim 10, additionally comprising a dc-ac converter coupled to said power supply.

18. A method of providing an alternate source of electrical power for a vehicle data recording system, comprising the steps of:
    monitoring an availability of electrical power from a vehicle electrical power distribution bus;
    initiating a charging of the vehicle data recording system backup power supply upon a first detection of said power availability from said bus;
    charging said backup power supply;
    maintaining said backup power supply in a fully charged condition;
    initiating a discharging of said backup power supply upon a detection of a power loss from said bus;
    discharging said backup power supply to the vehicle data recording system until a stop event occurs.

19. The method of providing an alternative source of power of claim 18, wherein the stop event comprises any one of the following events: said first detection occurs, said backup power supply is fully discharged, or a specified period of time elapses.

* * * * *